United States Patent [19]

Fekete

[11] Patent Number: 4,987,400
[45] Date of Patent: Jan. 22, 1991

[54] MAGNETICALLY DRIVEN VARIABLE RESISTOR GAUGE

[75] Inventor: Nicholas M. G. Fekete, Richardson, Tex.

[73] Assignee: Rochester Gauges, Inc., Dallas, Tex.

[21] Appl. No.: 393,523

[22] Filed: Aug. 11, 1989

[51] Int. Cl.$^5$ ............................................. H01C 10/32
[52] U.S. Cl. ..................................... 338/164; 338/174
[58] Field of Search ............... 338/174, 162, 163, 164, 338/165, 170, 171, 172, 175, 196, 32 R, 33; 73/313, 317

[56] References Cited

U.S. PATENT DOCUMENTS

| | | | |
|---|---|---|---|
| 3,364,321 | 1/1968 | Gessner | 338/36 X |
| 3,739,641 | 6/1973 | Taylor et al. | 73/313 |
| 4,812,804 | 3/1989 | Masaki | 338/32 R X |
| 4,835,509 | 5/1989 | Yoshino et al. | 338/32 R |
| 4,864,273 | 9/1989 | Tsuzuki et al. | 338/174 |

FOREIGN PATENT DOCUMENTS 1380031  1/1975  United Kingdom ................ 338/196

Primary Examiner—Bruce A. Reynolds
Assistant Examiner—M. M. Lateef
Attorney, Agent, or Firm—Richards, Medlock & Andrews

[57] ABSTRACT

An improved magnetically driven resistor gauge (50) which includes a plastic base and plastic cap hermetically sealed together by ultra sonic welding to isolate the interior (90) of the gauge from the external environment. A dedicated ground terminal (100) is molded into the cap to ensure an effective ground. A contact plate (118), forming a part of the pivotal pointer assembly, includes resilient arms (120, 121 and 122) which are in electrical contact with the ground terminal and resistance wire (94), respectively.

6 Claims, 3 Drawing Sheets

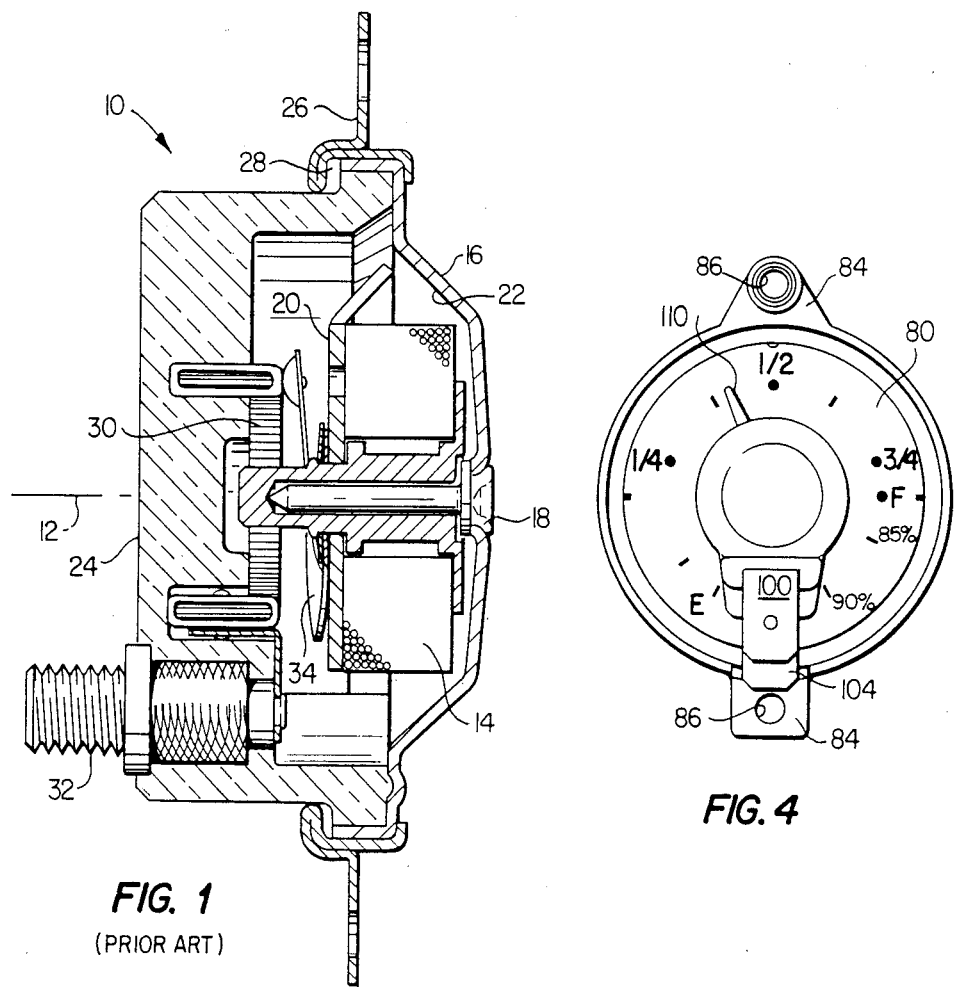
FIG. 1
(PRIOR ART)
FIG. 4
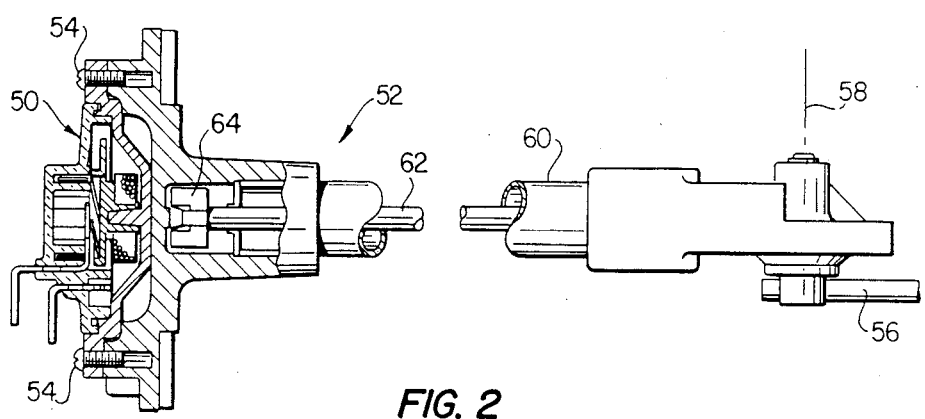
FIG. 2

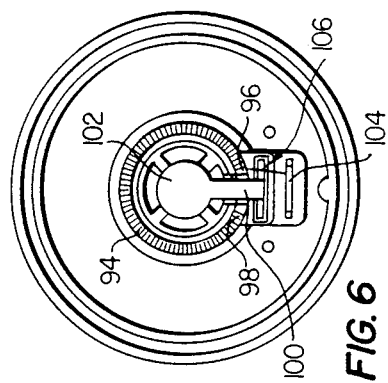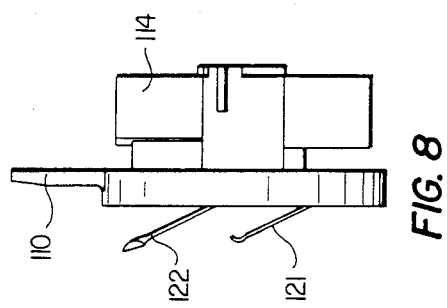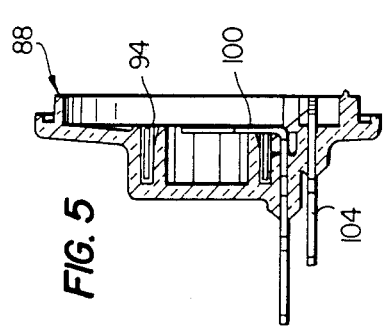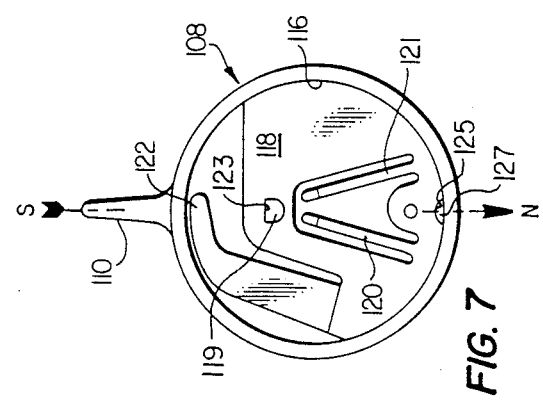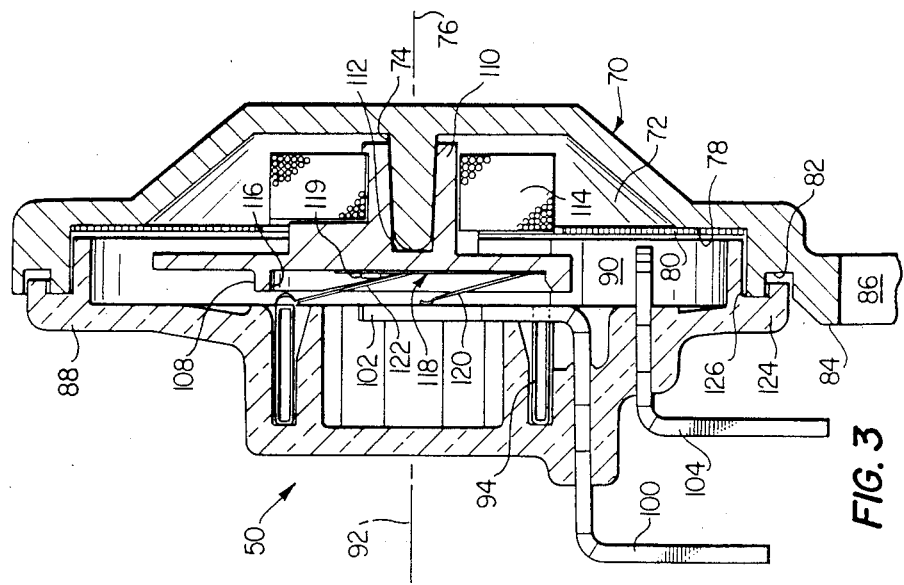

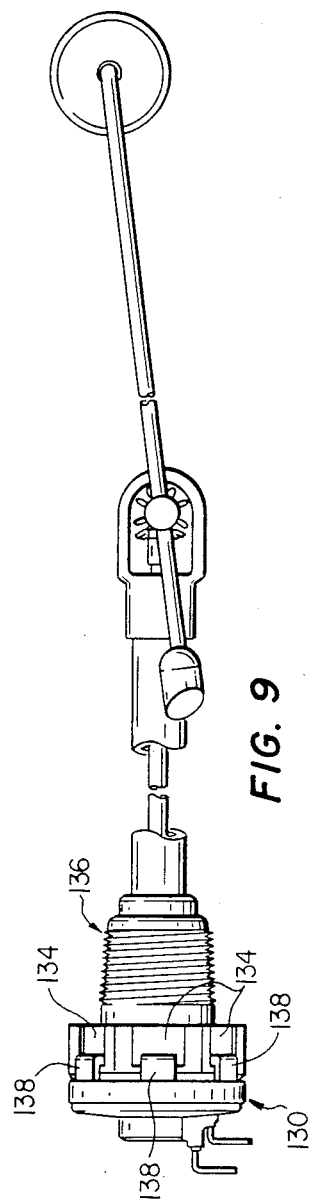

MAGNETICALLY DRIVEN VARIABLE RESISTOR GAUGE

TECHNICAL FIELD

This invention relates to gauge technology, and in particular to magnetically driven gauges having a variable resistive output to monitor a condition.

BACKGROUND OF THE INVENTION

Numerous applications exist where monitoring of a fluid level is important. For example, one application is in monitoring the level in an LPG tank, where both a visual indication of fluid level and electrical indication are desirable.

In the early sixties, Rochester Gauges, Inc. of Dallas, Texas introduced a magnetically driven variable resistor known as a "twin site" sender. This design utilized an annular resistance wire and cooperating arm in the electric circuit, and a pointer and dial for a visual output of fluid level.

The design of this sender included a formed metal base, on which is formed the dial face. The annular resistance wire was connected at one end to an external contact. A magnetically driven pointer assembly, having a resilient contact to sweep along the resistance wire, was grounded through the case by contact between the pointer assembly and the pointer stem on which the pointer assembly pivoted.

The magnetic drive feature is important because some fluid products, such as LPG, are stored under pressure. The magnetic drive allows the signal from the float mechanism inside of the tank to be transmitted through a solid, non-magnetic bulkhead without the necessity of dynamic seals or pressure tight conductors.

While a significant advance in the art, and still used today, a need exists for an improved sender which can be manufactured for less cost and be as reliable or more reliable than the original sender. Further, occasionally the ground contact between the pointer assembly and the case would be affected by corrosion, leading to a false resistance read out.

SUMMARY OF THE INVENTION

In accordance with one aspect of the present invention, a magnetically driven variable resistor gauge is provided. The gauge includes a plastic base having a base axis and defining a cavity. A rim is formed about the cavity on the base and a pin extends from the base into the cavity. A plastic cap is provided which includes a cap axis. An annular resistance wire is mounted in the cap concentric to the cap axis, with the wire having a first end and a second end. A ground terminal is mounted in the cap and extends over the cap axis. A wire terminal is mounted on the cap and electrically connected to the first end of the resistance wire.

A pointer assembly is included which has a pointer, a magnet and a conductive contact plate. The pointer has a recess to receive the pin in the base, which permits the pointer to pivot about the base axis. The magnet is mounted on the pointer to pivot the pointer to a position determined by an exterior signal. The conductive contact plate is mounted on the pointer and includes a resilient ground contact in constant contact with the ground terminal in the cap. The plate further includes a resilient wire contact which contacts the resistance wire at a position determined by the position of the pointer.

In accordance with other aspects of the present invention, the cap and base can be hermetically sealed together to isolate the interior of the gauge. The cap and base can be ultrasonically bound to achieve this result. Further, the gauge can have resilient arms permitting the gauge to be snap fit on a gauge assembly.

BRIEF DESCRIPTION OF THE DRAWINGS

A more complete understanding of the invention can be had by referring to the following Detailed Description, together with the accompanying drawings, wherein:

FIG. 1 is a cross sectional view of a prior art sender;

FIG. 2 is a cross sectional view of a gauge assembly using a gauge constructed in accordance with the teachings of the present invention;

FIG. 3 is a cross sectional view of the gauge;

FIG. 4 is a front view of the gauge;

FIG. 5 is a cross sectional view of the cap forming part of the gauge;

FIG. 6 is an end view of the cap;

FIG. 7 is a top view of a pointer assembly forming part of the gauge;

FIG. 8 is a side view of the pointer assembly; and

FIG. 9 a side view of a first modification of the gauge to snap fit to a gauge assembly.

DETAILED DESCRIPTION

Referring now to the drawings, wherein like reference numerals designate like or corresponding parts throughout the several views, and in particular to FIG. 1, there is illustrated a prior art gauge 10 which provides both a visual and electrical indication of fluid level when incorporated in a gauge assembly. As will be described hereinafter, the gauge assembly will typically incorporate a float which floats on the surface of the fluid where the level is measured. As this float moves with variation in the fluid level, it causes a magnet to rotate about an axis 12 which, in turn, causes a magnet 14 within the gauge 10 to follow the motion about the axis.

As can be seen in FIG. 1, gauge 10 includes a formed metal base 16 which defines a cavity in its interior. A metal pointer stem 18 is mounted in the center of the base to support a metal pointer 20 for pivotal motion about axis 12 relative to the pointer stem and base. Appropriate numbering and lettering is applied to the interior of the base to form a dial 22.

A plastic cap 24 is mounted to the base by crimping flange 26 about the base and cap. A seal material 28 provides for some isolation of the interior of the gauge 10 from exterior effects. The plastic cap 24 mounts an annular resistance wire 30, a first end of which is attached to a terminal 32 in the cap. Terminal 32 extends exterior the gauge for attachment of a monitoring instrument or the like. The pointer 20 has a resilient contact arm 34 which sweeps along the resistance wire 30 as the pointer moves in response to magnet 14. The contact arm is connected electrically through the metal pointer and base 16 so that a complete circuit is formed between the terminal 32 and base 16 which varies in resistance depending upon the position of the contact arm on the resistance wire. The gauge can thus be used to sense fluid level as a function of the position of the magnet 14 and pointer 20.

With reference to FIGS. 2-8, an improved gauge 50 is illustrated which has significant advantages over the prior art gauge 10. As seen in FIG. 2, the gauge 50 is, in one installation, mounted on a gauge assembly 52 by screws 54. The gauge assembly has a pivotally mounted float arm 56 which ends in a float (not shown). As the float varies position due to variation of fluid level being monitored, the float arm 56 pivots about axis 58 on housing 60. The pivot motion of arm 56 is translated to rotational motion of a shaft 62 extending through the housing 60 and ending at a magnet 64.

With reference to FIGS. 3-8, the details of the gauge 50 will be described. The gauge 50 includes a plastic base 70 which defines a cavity 72 therein. The base is formed with an upstanding pin 74 which is centered along the center axis 76 of the base. The base also defines an annular rim 78 concentric with the axis 76 to mount a dial plate 80. Preferably, the base and plate have some interlocking pin and groove arrangement to fix the position of the plate 80 to the base.

The base is further formed with a groove 82 and a flange 84 having various apertures 86 to bolt the gauge to the gauge assembly.

A plastic cap 88 is hermetically sealed to the plastic base 70 to form an airtight interior 90. The plastic cap has a central axis 92 which coincides with axis 76 when the cap is hermetically sealed to the base.

An annular resistance wire 94 is mounted in the cap concentric with axis 92. The resistance wire has a first end 96 and a second end 98. A ground terminal 100 is molded into the cap 88 which extends from exterior the cap, through a gap between the ends 96 and 98 of the resistance wire 94 to remain electrically isolated from the resistance wire, to a circular plate 102 intersecting the axis 92. A wire terminal 104 is molded into the cap 88 which extends from exterior the cap into the interior where it electrically connects to the first end of the resistance wire through lead 106.

A pointer assembly 108 is mounted within the gauge for pivotal motion about axes 76 and 92 as determined by the position of the magnet 64 in the gauge assembly to indicate the fluid level. The pointer assembly 108 includes a plastic pointer 110 with recess 112 which fits over the pin 74 to permit the pointer to pivot freely about the pin. A magnet 114 is mounted on the pointer which interacts with the magnet 64 in the gauge assembly. The pointer 110 also defines a cylindrical recess 116 on its upper surface for receiving a conductive metal contact plate 118. Plate 118 has a notch 125 which mates with protrusion 127 on pointer 110 to properly orient plate 118 in recess 116. Pointer 110 has a heat stake 119 extending from the recess 116. Plate 118 has a hole 123 which allows the plate 118 to be set in recess 116 with the stake extending through the hole. The plate 118 can be secured in recess 116 by melting the part of the heat stake 119 that extends through hole 123 over the top of plate 118.

The contact plate 118 has redundant resilient grounding arms 120 and 121 which resiliently engage the circular plate 102 when the cap and base are secured together. The plate further includes a resilient arm 122 which contacts the resistance wire 94 at a position determined by the angular position of the pointer assembly 108 about axes 76 and 92, which, in turn, is determined by the position of the magnet 64 in the gauge assembly and the position of the float measuring the fluid level. Therefore, the resistance measured between terminals 100 and 104 is a function of the float position, which allows the gauge 50 to be used to monitor the fluid level.

The cap 88 can be seen to be formed with a rim 124 with a recess 126. A portion of the rim 124 is received in groove 82 and the cap and base are preferably ultrasonically welded together to form a hermetically sealed gauge isolating the interior 90 from external effects. The seal is preferably capable of withstanding a pressure differential of at least eight inches of mercury between the interior and the exterior without failing.

The gauge 50 of the present invention has significant advantages over the prior art gauge. The gauge 50 is formed of fewer parts than gauge 10, and many parts in gauge 50 are manufactured of plastic to lower cost. Further, the printing of dial 22 on a curvilinear portion of the base 16 is eliminated by using a flat dial plate 80 which is simply laid in the base 70 of gauge 50. Further, gauge 50 has a dedicated grounding terminal 100 which eliminates any problem of electrical contact between the pointer and the base as was experienced in the prior art gauge. Further, the ultrasonic welding of the base to the cap provides much improved and reliable isolation of the interior of the gauge than was possible with the mechanical seal required in gauge 10.

With reference to FIG. 9, a first modification of the present invention is illustrated as gauge 130. Gauge 130 is identical in operating characteristics and components with gauge 50, but includes resilient plastic arms 138 extending the base 70 to be received in recesses 134 in the head 136 of housing 60 of a gauge assembly 52. This permits the gauge 130 to be snap fit over the head 136 of the housing so that the arms 138 engage the recesses on the head 136. A guide can be provided to ensure that the gauge 130 is mounted in the proper orientation on the head 136. The gauge 130 is resistant to tampering as it is virtually impossible to lift or bend all of the arms 138 simultaneously, unless a special tool is provided, to remove the gauge 130 from the head 136. For example, six equally spaced resilient arms 138 can be used to engage six notches on the head.

Although a single embodiment of the invention has been illustrated in the accompanying drawings and described in the foregoing Detailed Description, it will be understood that the invention is not limited to the embodiment disclosed, but is capable of numerous rearrangements, modifications and substitutions of parts and elements without departing from the spirit of the invention.

I claim:

1. A magnetically driven variable resistor gauge, comprising:
    a plastic base having a base axis and defining a cavity, a rim being formed about the cavity on the base, a pin extending from the base into the cavity;
    a plastic cap having a cap axis;
    an annular resistance wire mounted in the cap concentric to the cap axis, the resistance wire having a first end and a second end;
    a ground terminal mounted in the cap, the ground terminal extending over the cap axis;
    a wire terminal mounted in the cap and electrically connected to the first end of the resistance wire;
    a pointer assembly, including:
        a pointer with a recess to receive the pin, permitting the pointer to pivot about the base axis;
        a magnet mounted on the pointer to pivot the pointer; and
        a conductive contact plate mounted on the pointer assembly, the plate having a resilient ground contact contacting the ground terminal and a resilient wire contact contacting the resistance wire at a position determined by the position of the pointer.

2. The resistor gauge of claim 1 wherein the plastic base and plastic cap are hermetically sealed together to form an isolated interior.

3. The resistor gauge of claim 1 wherein the plastic base and plastic cap are ultrasonically welded together to form an interior isolated from the exterior of the gauge.

4. The resistor gauge of claim 1 wherein the plastic base has a plurality of resilient arms extending therefrom, the gauge further comprising a gauge assembly including a head, the head having a corresponding number of notches to receive the arms, the gauge being snap fit on the gauge assembly with the arms and notches.

5. The resistor gauge of claim 1 wherein the ground terminal and wire terminal are molded into the plastic cap.

6. The resistor gauge of claim 1 wherein the conductive contact plate has at least two resilient ground contacts contacting the ground terminal for redundancy.

* * * * *